US011984464B2

(12) United States Patent
Mun et al.

(10) Patent No.: US 11,984,464 B2
(45) Date of Patent: May 14, 2024

(54) CMOS IMAGE SENSOR HAVING FRONT SIDE AND BACK SIDE TRENCH ISOLATION STRUCTURES ENCLOSING PIXEL REGIONS AND A CAPACITOR FOR STORING THE IMAGE CHARGE

(71) Applicant: OmniVision Technologies, Inc., Santa Clara, CA (US)

(72) Inventors: Seong Yeol Mun, Santa Clara, CA (US); Yuanliang Liu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 332 days.

(21) Appl. No.: 16/946,842

(22) Filed: Jul. 8, 2020

(65) Prior Publication Data

US 2022/0013551 A1    Jan. 13, 2022

(51) Int. Cl.
*H01L 27/146* (2006.01)
*H01L 21/762* (2006.01)

(52) U.S. Cl.
CPC .... *H01L 27/1463* (2013.01); *H01L 21/76224* (2013.01); *H01L 27/14605* (2013.01); *H01L 27/14607* (2013.01); *H01L 27/14616* (2013.01); *H01L 27/1464* (2013.01); *H01L 27/14643* (2013.01)

(58) Field of Classification Search
CPC ........... H01L 27/14603; H01L 27/1463; H01L 27/1464; H01L 27/14689
See application file for complete search history.

(56) References Cited

U.S. PATENT DOCUMENTS

| 11,189,655 | B1* | 11/2021 | Mun | H01L 27/14643 |
| 11,444,108 | B2* | 9/2022 | Mun | H01L 27/14641 |
| 11,450,696 | B1* | 9/2022 | Zang | H04N 25/75 |
| 2015/0372031 | A1* | 12/2015 | Yoon | H01L 27/1463 |
| | | | | 257/446 |

(Continued)

FOREIGN PATENT DOCUMENTS

TW    201735244 A    10/2017

OTHER PUBLICATIONS

Taiwan Office Action mailed Feb. 17, 2024, issued in related Taiwanese Application No. 110124904 filed Jul. 7, 2021, 8 pages.

*Primary Examiner* — Anh D Mai
(74) *Attorney, Agent, or Firm* — Christensen O'Connor Johnson Kindness PLLC

(57) ABSTRACT

Examples of the disclosed subject matter propose disposing trench isolation structure around the perimeter of the pixel transistor region of the pixel cell. The trench isolation structure includes front side (e.g., shallow and deep) trench isolation structure and back side deep trench isolation structure that abut against or contacts the bottom of front side deep trench isolation structure for isolating the pixel transistor channel of the pixel cell's pixel transistor region. The formation and arrangement of the trench isolation structure in the pixel transistor region forms a floating doped well region, containing, for example, a floating diffusion (FD) and source/drains (e.g., (N) doped regions) of the pixel transistors. This floating P-well region aims to reduce junction leakage associated with the floating diffusion region of the pixel cell.

19 Claims, 7 Drawing Sheets

(56) References Cited

U.S. PATENT DOCUMENTS

| | | | |
|---|---|---|---|
| 2016/0093651 A1* | 3/2016 | Sato | H01L 27/14638 |
| | | | 257/229 |
| 2019/0356872 A1* | 11/2019 | Manabe | H04N 5/353 |
| 2020/0098798 A1* | 3/2020 | Takahashi | H01L 27/14603 |
| 2021/0202553 A1* | 7/2021 | Mun | H01L 27/1463 |
| 2021/0225927 A1* | 7/2021 | Mun | H01L 27/14687 |
| 2022/0159206 A1* | 5/2022 | Gao | H04N 5/363 |

* cited by examiner

CMOS IMAGE SENSOR HAVING FRONT SIDE AND BACK SIDE TRENCH ISOLATION STRUCTURES ENCLOSING PIXEL REGIONS AND A CAPACITOR FOR STORING THE IMAGE CHARGE

BACKGROUND INFORMATION

Field of the Disclosure

This disclosure relates generally to image sensors, and in particular but not exclusively, relates to image sensors, such as high dynamic range (HDR) image sensors, that aim to suppress floating diffusion junction leakage.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality of the image. For example, excess current leakage within certain regions of the image sensor may cause high dark current, sensor noise, white pixel defects, and the like. These defects may significantly deteriorate the image quality from the image sensor, which may result in reduced yield and higher production costs.

High dynamic range (HDR) image sensors may present other challenges. For example, some HDR image sensor layouts are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk or other unwanted side effects, such as diagonal flare that can occur in these image sensors as the pitches are reduced.

Figure 1:
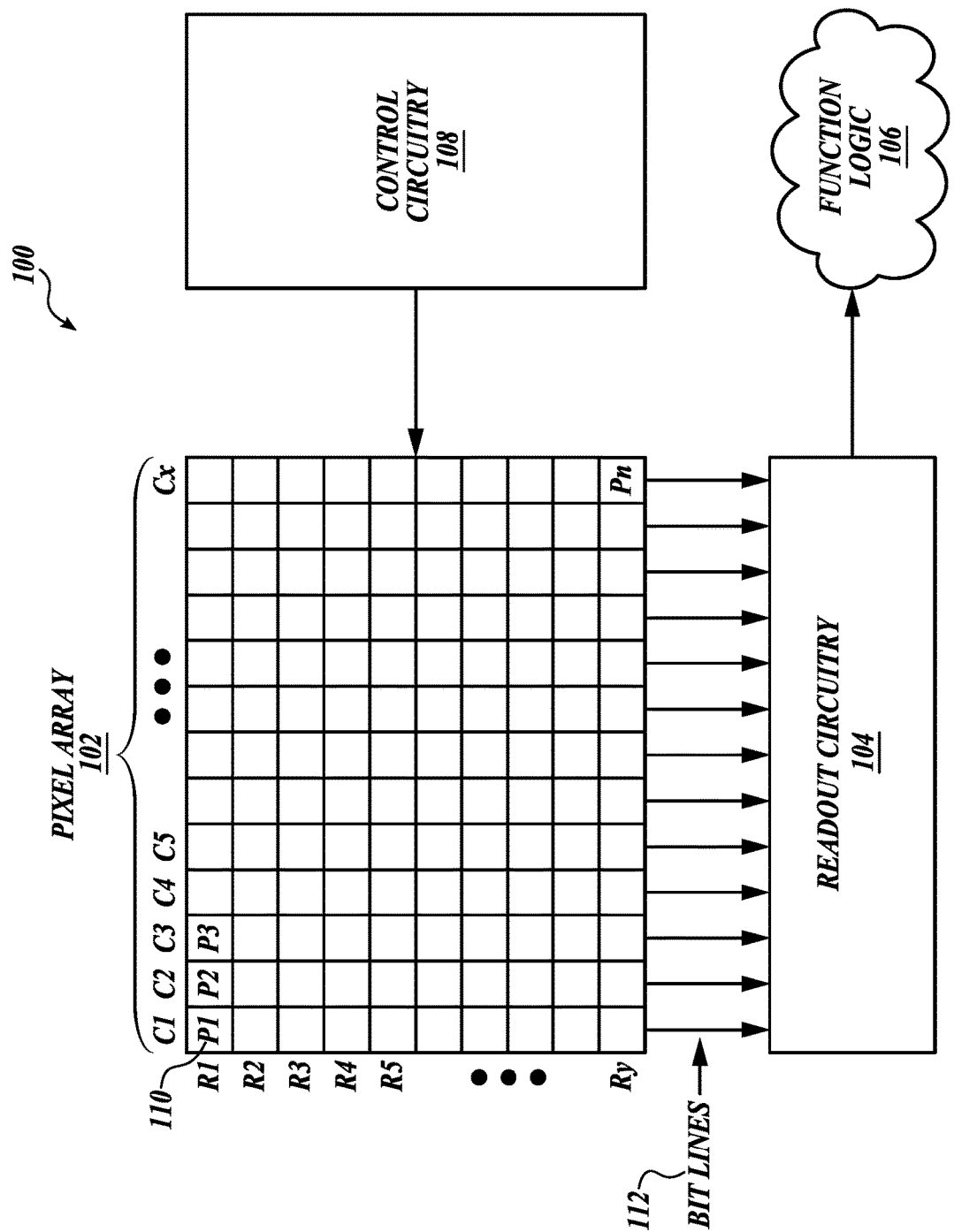
FIG. 1 illustrates one example of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus and method for suppressing floating diffusion junction leakage in CMOS image sensors are described herein. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of a pixel cell of an image sensor are disclosed. One or more of these examples can be arranged in a pixel array and employed, for instance, for high dynamic range imaging. In some examples, the pixel cells of the pixel array can employ 4T or 5T pixel architectures. In some examples, a shared pixel cell architecture is employed in which two or more photosensitive regions, such as photodiode regions, are coupled to a common floating diffusion via first and second transfer gates and include three or more pixel transistors, such as a reset transistor, a source follower, a row select transistor, and dual floating diffusion transistor.

In other examples of the pixel array, each pixel cell is configured according to a LOFIC architecture. In a pixel cell with a LOFIC architecture, or LOFIC pixel cell, a lateral overflow integrated capacitor (LOFIC) and an associated select transistor, sometimes referred to as a Dual Floating Diffusion (DFD) transistor, are provided. When, for example, the photodiode is filled after reaching saturation, the excess charge is leaked into the floating diffusion (FD) region and can be stored in the LOFIC. Leaking charges in this manner functions like a photodiode with an increasing full well capacity (FWC). Selective increases/decreases in the capacitance of the floating diffusion (FD) of the pixel cell can be utilized to modulate conversion gains. This results in a significant increase the signal/noise ratio (SNR), thereby increasing the dynamic-range (e.g., HDR) of the pixel cell for various HDR imaging applications.

While a LOFIC architecture may be used to increase dynamic range, such an architecture is not without problems. For example, leakage current at or near the floating diffusion region(s) may impact signal readout from the floating diffusion region(s) by readout circuitry due to deficiencies such as a high dark current, white pixel defects, low signal-to-noise ratio, and the like. White pixel defects, for example, may be related to current leakage from regions subjected to mechanical stress during fabrication, electrical stress during device operation, or a combination thereof. Leakage current may be a particularly significant issue when the image charge, image data, or image signal is stored within the floating diffusion region(s) for long periods of time before readout, which sometimes occurs in LOFIC pixel cells.

In addition, leakage by Generation-Recombination (GR) in the floating diffusion junction, especially with the use of highly doped, ohmic contacts, is inevitable. Floating diffusion junction leakage in dark mode (i.e., no light) is stored in the LOFIC during integration, contributing to dark-current/white pixel issues. In fact, dark-current caused by floating diffusion junction leakage is one of the biggest issues attributable to a LOFIC architecture.

For example, in the case of high conversion gain (HCG), the dark-current caused by floating diffusion junction leakage is typically not an issue, because the floating diffusion is reset before signal read-out, and as such, read noise (including noise caused by junction leakage) can be eliminated by a correlated double sampling (CDS) operation. However, the floating diffusion junction leakage induced dark-current can be a significant issue in low conversion gain (LCG), because the signal is read out before reset-level read-out. As such, a correlated double sampling (CDS) operation cannot be applied to remove junction leakage noise. And if the signal is reset before it is read out, all the charges stored are depleted via discharge.

The methodologies and technologies of the present disclosure seek to address these issues associated with pixel cells having a LOFIC architecture, or others. For instance, examples of the disclosed subject matter aim to minimize or reduce the leaking current at or near the floating diffusion region of a pixel cell for facilitating increased image quality, increased yield, faster speed, etc. In particular, examples of the disclosed subject matter reduce diffusion leakage (e.g., gate induced drain leakage, junction leakage, etc.) associated with the floating diffusion region of, for example, a shared-pixel design.

As will be described in more detail below, the transistors of the pixel cell in example embodiments may be of the N-metal-oxide-semiconductor (NMOS) type, in which the metal may be polycrystalline silicon (poly-Si), tungsten (W) and the like, the oxide may be a dielectric such as silicon oxide $SiO_2$ (e.g., thermally grown or deposited on the semiconductor substrate or material), and the semiconductor may correspond to a portion of the semiconductor substrate or material, such as silicon (e.g., single crystal or polycrystalline Si), silicon on insulator (SOI), etc.

In the various examples described herein, trench isolation structure is strategically positioned to reduce diffusion leakage (e.g., gate induced drain leakage, junction leakage, etc.) associated with the floating diffusion region of a pixel cell, for example a LOFIC pixel cell. In some example embodiments, the trench isolation includes front side (e.g., shallow and deep) trench isolation structure that cooperates with back side (e.g., deep) trench isolation structure to reduce diffusion leakage by, for example, isolating the transistor channel region of the pixel cell.

More specifically, various examples of the disclosed subject matter propose disposing front side shallow trench isolation (STI) structure and front side deep trench isolation (F-DTI) structure in both the pixel region and the pixel transistor region of the pixel cell. In some examples of the disclosed subject matter, the front side deep trench isolation (F-DTI) structure is disposed under the shallow trench isolation (STI) structure and extends toward the back side of the semiconductor substrate or material for contact with back side deep trench isolation (B-DTI) structure. In example embodiments, the front side shallow trench isolation (STI) structure and front side deep trench isolation (F-DTI) structure can be integrally formed, for example.

In addition, the disclosed subject matter proposes disposing back side deep trench isolation (B-DTI) extending into the semiconductor substrate or material from the back side of the semiconductor substrate. In some examples of the disclosed subject matter, the back side deep trench isolation (B-DTI) structure is disposed in the pixel transistor region and is in contact the bottom of the front side deep trench isolation (F-DTI) structure for isolating the transistor channel region from adjacent photosensitive regions. The disclosed subject matter alternatively or additionally proposes disposing back side deep trench isolation structure between photodiode regions of adjacent pixel cells to electrically and/or optically isolate the photodiode regions. In these example embodiments, the back side deep trench isolation structure is in contact with or abuts against the front side deep trench isolation (F-DTI) structure. In one example, the back side deep trench isolation structure is structurally connected to the front side deep trench isolation (F-DTI) structure.

The formation and arrangement of the trench isolation structure in the pixel cell, especially in the pixel transistor region, enclose a transistor channel region that includes a floating doped well region, such as a P-doped well region (P-well), containing the floating diffusion and source/drains (e.g., (N) doped regions) of the pixel transistors. In some example embodiments, the floating P-type well region is formed along the transistor channel (e.g., N-channel) of the pixel transistor region to isolate the transistor channel from the pixel regions (e.g., photodiodes) of the pixel array. This floating P-type well region aims to reduce leakage associated with the floating diffusion region of the pixel cell.

To illustrate, FIG. 1 illustrates a block diagram illustrating an example image sensor 100, such as an HDR image sensor, in accordance with technologies and methodologies of the present disclosure. Image sensor 100 may be implemented as complementary metal-oxide-semiconductor ("CMOS") image sensor. As shown in the example illustrated in FIG. 1, image sensor 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, . . . , Pn). In one example, each pixel cell includes one or more subpixels or pixel regions that can be used for HDR imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, . . . , Pn) may include, for example, a LOFIC and associated structure to provide, for example, HDR imaging in accordance with technologies and methodologies of the present disclosure.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, may be what are known as 4T pixel cells, e.g., four-transistor pixel cells. In other non-limiting embodiments, the pixel cells 110 may be what are known as 5T pixel cells, e.g., five-transistor pixel cells, including a 5T pixel cell having a LOFIC architecture. For example, the pixel cells 110 in some non-limiting embodiments may further include a dual floating diffusion (DFD) transistor and an associated capacitor (e.g., LOFIC). The associated capacitor may be selectively coupled via the dual floating diffusion transistor to increase/decrease the capacitance of the floating diffusion, which can modulate conversion gains.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2:
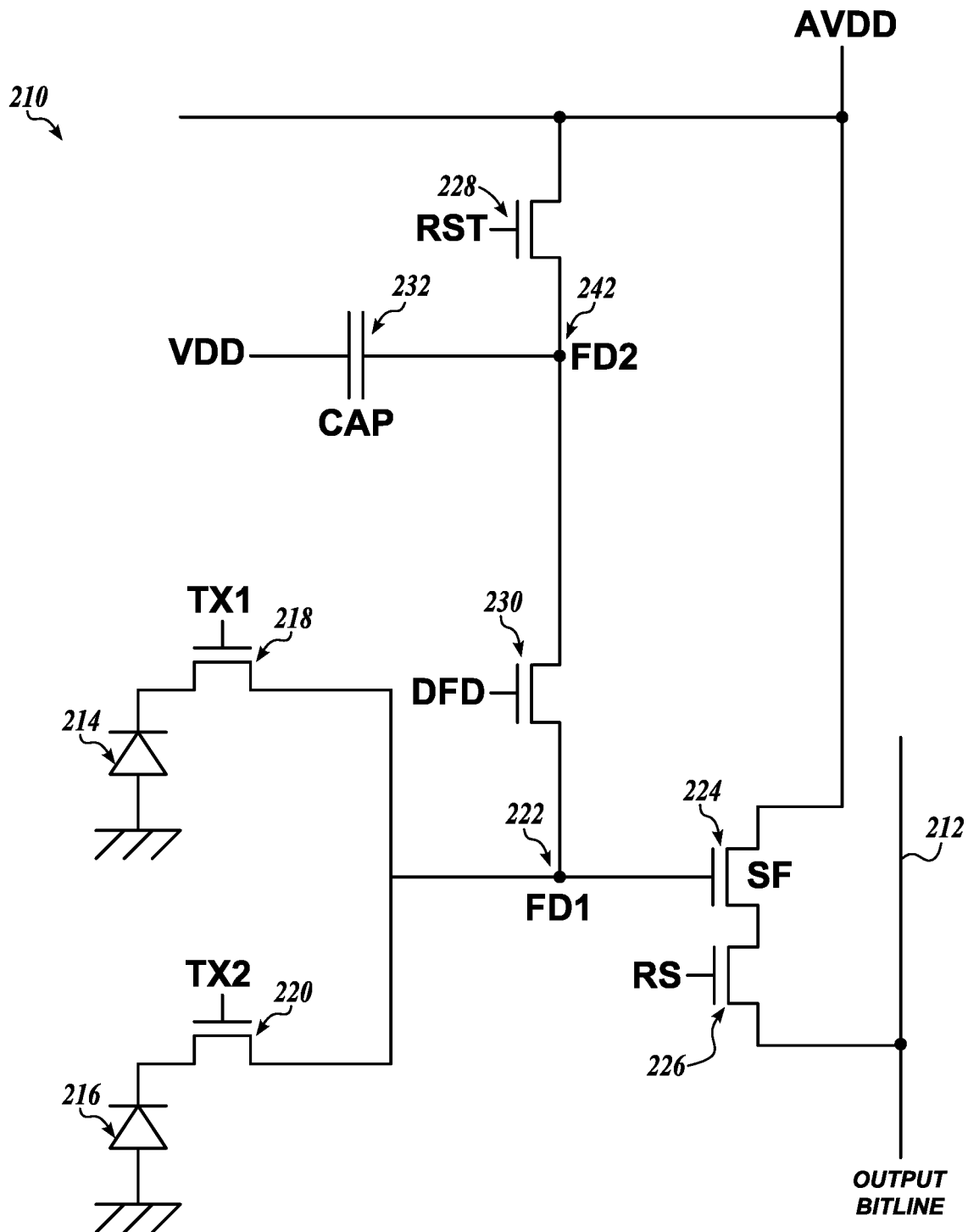
FIG. 2 is an illustrative schematic of one example of a pixel cell in accordance with an embodiment of the present disclosure.

FIG. 2 is an illustrative schematic of an example pixel cell 210 in accordance with the teachings of the present disclosure. It is appreciated that pixel cell 210 of FIG. 2 may be an example of a pixel cell 110 of FIG. 1, and that similarly named and numbered elements referenced below may be coupled and function similar to as described above. For example, the pixel cell 210 may be coupled to a bitline, e.g., readout column, which may provide image data to readout circuitry, such as the readout circuitry 106, and the pixel cell 210 may receive control signals from control circuitry, such as control circuitry 108, to control the operation of the various transistors of the pixel cell 210. The control circuitry 108 may control the operation of the transistors in desired sequences with relative timing in order to reset the pixel to a dark state, for example, and to read out image data after an integration, for example.

The illustrated example of the pixel cell 210 includes a first photosensitive or photoelectric conversion element, such as first photodiode 214, and a second photosensitive or photoelectric conversion element, such as second photodiode 216. In operation, the first and second photodiodes 214, 216 are coupled to photogenerate image charge in response to incident light. In an embodiment, the first and second photodiodes 214 and 216 can be used to provide image data for a high dynamic range (HDR) image, for example.

Pixel cell 210 also includes a first transfer gate 218, a second transfer gate 220, and first floating diffusion (FD1) 222 disposed between the first and second transfer gates 218, 220. First transfer gate 218 is coupled to transfer image charge from first photodiode 214 to the first floating diffusion 222 in response to a first transfer gate signal TX1. Second transfer gate 220 is coupled to transfer image charge from second photodiode 214 to the first floating diffusion 222 in response to a second transfer gate signal TX2. In the depicted arrangement, the first floating diffusion 222 is common to both the first and second photodiodes 214, 216, and can be referred to as a common floating diffusion 222.

A reset transistor 228 is coupled to the common floating diffusion 222 to reset the pixel cell 210 (e.g., discharge or charge the first and second photodiodes 214, 216, and the first floating diffusion 222 to a preset voltage (e.g., AVDD) in response to a reset signal RST. The gate terminal of an amplifier transistor 224 is also coupled to the first floating diffusion 222 to generate an image data signal in response to the image charge in the first floating diffusion 222. In the illustrated example, the amplifier transistor 224 is coupled as a source-follower (SF) coupled transistor. A row select transistor 226 is coupled to the amplifier transistor SF 224 to output the image data signal to an output bitline 212, which is coupled to readout circuitry such as readout circuitry 104 of FIG. 1, in response to a row select signal RS. In the illustrated embodiment, the drain of the reset transistor 228 and the drain of the amplifier transistor 224 are coupled to received same supply voltage e.g., AVDD, however in other embodiments, the drain of the reset transistor 228 and the drain of the amplifier transistor 224 may be couple to receive different supply voltages i.e., the voltage supply to the drain of the reset transistor 228 and the drain of the amplifier transistor 224 can be different.

In another example embodiment, a dual floating diffusion transistor 230 may be optionally coupled between the first floating diffusion 222 and the reset transistor 228. A capacitor (CAP) 232, such as a LOFIC, also may be optionally included and coupled to the dual floating diffusion transistor 230 to form a LOFIC pixel cell. When included, a second floating diffusion (FD2) 242 is formed between the reset transistor 228 and the dual floating diffusion transistor 230. In operation, the dual floating diffusion transistor 230 is adapted to couple the capacitor 232 to the first floating diffusion 222 in response to a dual floating diffusion signal DFD to provide additional dynamic range capabilities to the pixel cell 210 if desired. In the depicted arrangement, the capacitor 232 is also coupled to a voltage, such as voltage VDD, for adjusting the capacitance of the capacitor 232 to store as many charges as possible overflowing from the pixel cell 210.

Control signals TX1 and TX2 enable the transfer gates 216, 218 to transfer the charges from the photodiodes 214, 216 to the first floating diffusion 222. The amount of charge transferred from the photodiodes 214, 216 to the first floating diffusion may depend on a current operation of the pixel cell 210. For example, during a reset operation, the charge may be charge generated in a dark state of the photodiode(s), but during an integration, the charge may be photogenerated image charge. At the end of an integration, the image charge may be readout twice with one or more dark readings occurring between the two to perform correlated double sampling (CDS).

Figure 3:
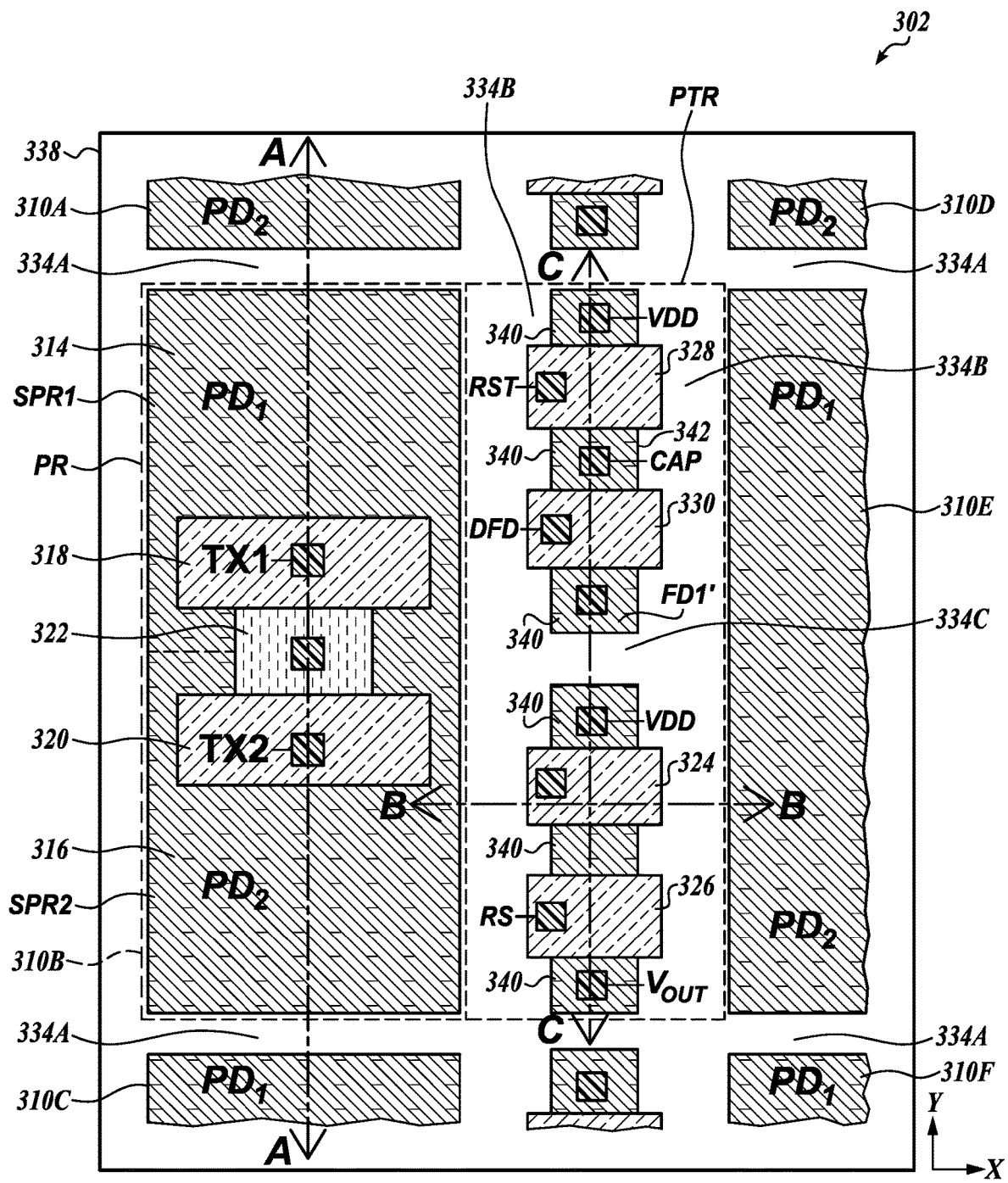
FIG. 3 is a top schematic partial view of one example of a pixel array in accordance with an embodiment of the present disclosure.

FIG. 3 is a layout schematic view, or top schematic view, of an example pixel array 302 comprising one or more pixel cells 310A-310N in accordance with technologies and methodologies of the present disclosure. It is appreciated that the pixel cells 310 of FIG. 3 may be an example of pixel cell 210 of FIG. 2, or an example of pixel cell 110 of FIG. 1, and that similarly named and numbered elements referenced below may be coupled and function similar to as described above.

For brevity and clarity, pixel cell 310B of the pixel array 302 will now be described in more detail. It will be appreciated that the other pixel cells 310 of the pixel array 302 are constructed substantially identical to pixel cell 310B, and thus, will not be separately described. As shown in the example depicted in FIG. 3, pixel cell 310B includes a pixel region PR, composed of two subpixel regions SPR1, SPR2, and a pixel transistor region PTR. Embodiments of the pixel cell 310 that include more than one subpixel region "share" the pixel transistor region PTR, and thus, can be referred to as a shared pixel cell. It is appreciated by those skilled in the art that the number of subpixel regions to be included in a pixel cell may vary based on image sensor design, and is not limited to the illustrated example.

As shown in the example depicted in FIG. 3, the pixel region PR of the pixel cell 310B includes first and second subpixel regions SPR1, SPR2, also referred to as subpixels. The first and second subpixel regions SPR1, SPR2 include respective first and second photosensitive or photoelectric conversion elements, such as photodiodes (PD) 314, 316. The first and second photodiodes 314, 316 are formed or otherwise disposed in a semiconductor substrate or material 338 (semiconductor substrate and semiconductor material are used interchangeably throughout specification). The semiconductor material 338 may comprise, for example, any type of semiconductor body or substrate (e.g., silicon/ CMOS bulk, SiGe, SOI, etc.) such as a semiconductor wafer, one or more die on a wafer, or any other type of semiconductor and/or epitaxial layers formed thereon and/or otherwise associated therewith.

In operation, the first and second photodiodes 314, 316 are adapted to photogenerate image charge in response to incident light. In one example embodiment, the first and second photodiodes 314, 316 are n-type pinned photodiodes (NPPDs). As illustrated in the depicted example, the first and second photodiodes 314, 316 can be coupled to the common floating diffusion (FD) 322 via first and second transfer gates 318, 320, respectively.

For example, the floating diffusion 322 is disposed in the semiconductor material 338 in-between the first transfer gate 318 and second transfer gate 320. In operation, the first transfer gate 318 is coupled to transfer the image charge from the first photodiode 314 to the common floating diffusion 322 in response to a first transfer gate signal TX1. The second transfer gate 320 is coupled to transfer the image charge from the second photodiode 316 to the floating diffusion 322 in response to a second transfer gate signal TX2.

Still referring to the example depicted in FIG. 3, the pixel transistor region PTR of pixel cell 310B is positioned adjacent the first and second subpixel regions SPR1 and SPR2. Within the pixel transistor region PTR, the pixel cell 310 includes a gate and doped regions (i.e., drain and source) for a reset transistor, a dual floating diffusion transistor, an amplifier transistor acting as a source-follower (SF), and a row select transistor. For example, as shown in the embodiment depicted in FIG. 3, the pixel transistor region PTR includes a plurality of transistor gates, including reset transistor gate 328, dual floating diffusion transistor gate 330, amplifier transistor gate 324 and row select gate 326, as well as source/drains 340 are formed or otherwise disposed in/on the semiconductor material 338. In one example embodiment, the respective gates and sources/drains and associated doped well(s) of the pixel transistor region PTR are generally aligned to form a transistor channel region, such as a (N) channel region, having a length direction corresponding to the Y direction of the semiconductor material 338.

In embodiments, the transistor channel region may include, for example, a part of floating diffusion region, such as part of floating diffusion (FD1) 222 and/or floating diffusion (FD2) 242 coupled to capacitor 232 disposed in the semiconductor substrate, such as semiconductor material 338, to receive the image charge from the photosensitive region, such as pixel region PR. In embodiments, the pixel transistor region PTR comprises, for example, a plurality of transistors, such as transistors 224, 226, 228, and 230, that include a plurality of transistor gates 324, 326, 328, 330 disposed on the front side 354 of the semiconductor substrate, such as semiconductor material 338, and a plurality of doped source/drain regions 340 disposed in the front side 354 of the semiconductor substrate, such as semiconductor material 338, and positioned adjacent respective transistor gates 324, 326, 328, 330. In an embodiment, the plurality of doped source/drain regions 340 each have a first type. The pixel transistor region PTR further includes a doped well region 382 (hidden in FIG. 3) disposed in the semiconductor substrate, such as semiconductor material 338, in surrounding relationship with respect to the plurality of source/drain regions 340. In an embodiment, the doped well region 382 has a second type that is different from the first type of the plurality of source/drain regions 340.

As shown in the example depicted in FIG. 3, contacts are provided on each gate of the pixel region for transmission of TX1 and TX2 signals, and on each gate of the pixel transistor region PTR for transmission of RST, DFD, and RS signals. Contacts are also provided on various source/drains 340 for coupling to the capacitor CAP, a voltage, such as voltage VDD, or to output a signal, such as voltage Vout. Other contacts may be provided on one or more source/drains 340 for coupling to, for example, the terminal of the floating diffusion 322. Such a source/drain 340 may be also referred to as part of the first floating diffusion (FD1), and referenced in FIG. 3 as FD1'. In one example, the floating diffusion 322 is also coupled to the capacitor CAP through DFD transistor via metal line for modulating conversion gain for the pixel cell 310B.

As illustrated in the example depicted in FIG. 3, the pixel array 302 also includes trench isolation structure, including shallow trench isolation (STI) structure disposed in the front side of the semiconductor material 338, for isolation purposes. For example, shallow trench isolation structure 334A is positioned between pixel cells (e.g., pixel cells 310A, 310C) of adjacent pixel cells 310. As illustrated in the example depicted in FIG. 3, shallow trench isolation structure 334B is provided in the pixel transistor region PTR of each pixel cell 310. Shallow trench isolation structure 334B is formed between pixel region PR and pixel transistor region PTR providing isolation between pixel transistors and adjacent photodiodes 314, 316. Accordingly, in the example illustrated in FIG. 3, the shallow trench isolation structures 334A and 334B are interconnected and formed as a grid-like structure, extending in the X-direction (334A) and the Y-direction (334B) of the pixel array 302.

In some example embodiments, the pixel transistor region PTR of each pixel cell 310 also includes shallow trench isolation structure 334C positioned between a first transistor section (e.g., reset transistor 328, dual floating diffusion transistor 330, etc.) of the pixel transistor region PTR and a second transistor section (e.g., amplifier transistor 324, row select transistor 326) of the pixel transition region PTR. The shallow trench isolation structure 334C extends between, and can be integrally formed with, the shallow trench isolation structure 334B. It is understood that shallow trench isolation structure can refer to the entirety of the grid structure or any part thereof.

Also as discussed further below, the trench isolation structure of the pixel array 310 includes front side deep trench isolation (F-DTI) structure (hidden in FIG. 3) extending into the semiconductor material 338 from the respective shallow trench isolation structure 334A, 334B, 334C. In some example embodiments, the front side deep trench isolation (F-DTI) structure and the respective shallow trench isolation structure are integrally formed. Accordingly, the front side deep trench isolation (F-DTI) structure can also be formed as a grid-like structure, extending in the X-direction (beneath shallow trench isolation structure 334A, 334C) and the Y-direction (beneath shallow trench isolation structure 334B) of the pixel array 302. It is understood that front side deep trench isolation structure can refer to the entirety of the grid structure or any part thereof.

Further as discussed further below, the trench isolation structure of the pixel array 302 includes back side deep trench isolation (B-DTI) structure (hidden in FIG. 3) disposed in the back side of the semiconductor material 338. For example, the pixel array 302 includes back side deep trench isolation (B-DTI) structure positioned under the front side deep trench isolation structures (F-DTI), including back side deep trench isolation structure extending around the perimeter of the pixel transistor region PTR. As will be discussed further below, the back side deep trench isolation (B-DTI) structure that extends around the perimeter of the pixel transistor region abuts against the bottom of the respective front side deep trench isolation (F-DTI) structure. In an example embodiment, back side deep trench isolation (B-DTI) structure (hidden in FIG. 3) is also positioned beneath the transistor channel region of the pixel transistor region PTR in the length wise (e.g., Y) direction between front side deep trench isolation structure (F-DTI). It is understood that deep trench isolation structure can refer to the entirety of the grid structure or any part thereof.

As briefly discussed above and discussed in more detail below, example embodiments in accordance with the methodologies and technologies of the disclosure are directed to a pixel cell having an arrangement of trench isolation structure, including both back side trench isolation (B-DTI) structure and front side trench isolation structure (STI 334, F-DTI) that isolate the transistor channel region of the pixel transistor region PTR from the pixel regions PR (e.g., photodiodes) of the pixel array. In example embodiments, such an arrangement of the trench isolation structure allows for a floating P-doped well region having floating diffusion and source/drain regions of the pixel transistor formed therein, thereby eliminating the junction leakage path and preventing junction leakage. Example embodiments also include a pixel array comprised of a plurality of such pixel cells arranged in rows and columns, for example.

Also as will be described in more detail below, a variety of materials and fabrication techniques may be utilized to form the pixel array 302. The semiconductor material 338 may have a composition of Si (e.g., single crystal or polycrystalline Si). The gates may have a composition including tungsten or polycrystalline silicon. Dielectric layers (not shown) may have a composition of $SiO_2$, $HfO_2$, or any other suitable dielectric medium known by one of ordinary skill in the art. Contacts may be constructed of any doped material with low ohmic resistance. Other metals, semiconductors, and insulating materials may also be utilized for pixel array 302, as known by one of ordinary skill in the art. Doped regions of the semiconductor material may be formed by diffusion, implantation, and the like. It will be appreciated that the doping polarities and/or doping types (P-type, N-type, etc.) in the illustrative embodiments may be reversed in alternative embodiments. Fabrication techniques such as photolithography, masking, chemical etching, ion implantation, thermal evaporation, chemical vapor deposition, sputtering, and the like, as known by one of ordinary skill in the art, may be utilized to fabricate the pixel cell 310, the pixel array 302, and/or the image sensor 100.

Figure 4A:
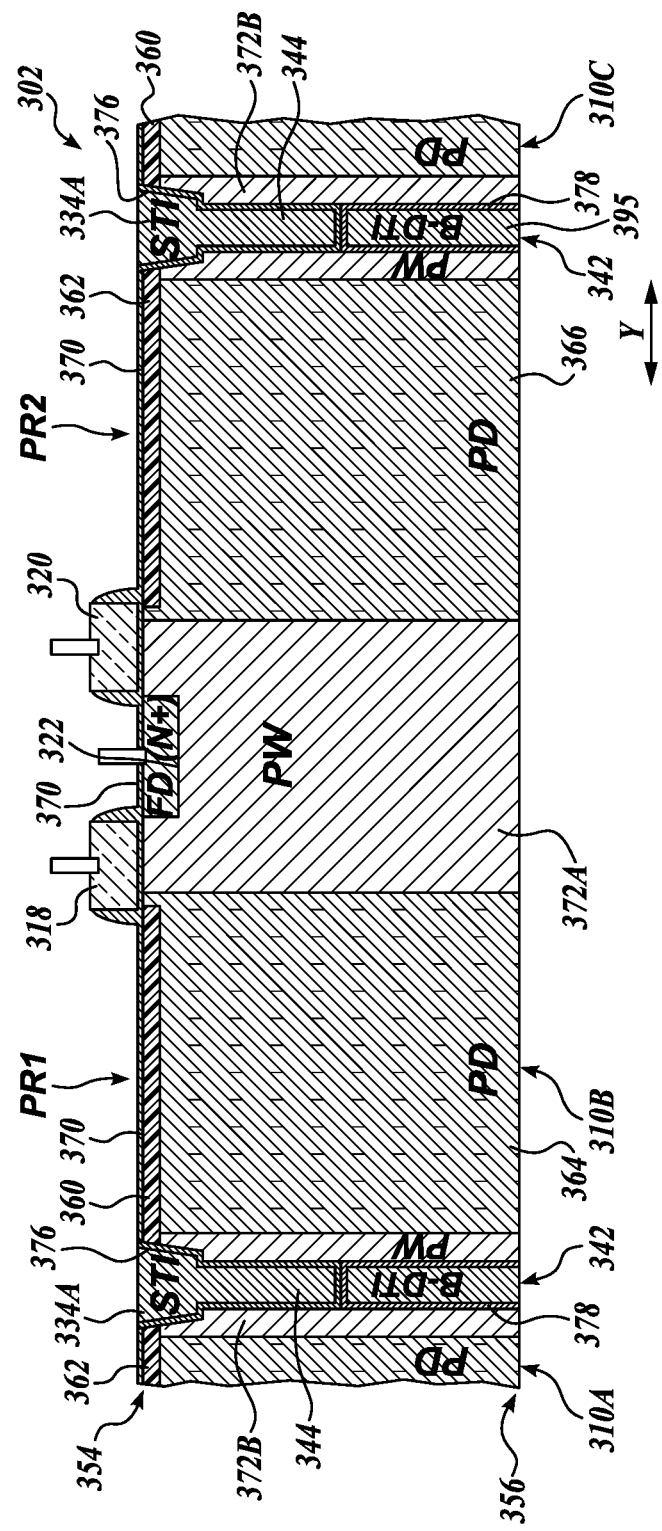
FIGS. 4A-4C are schematic cross sectional views of the pixel array of FIG. 3, taken along lines A-A, B-B, and C-C, respectively.
Figure 4B:
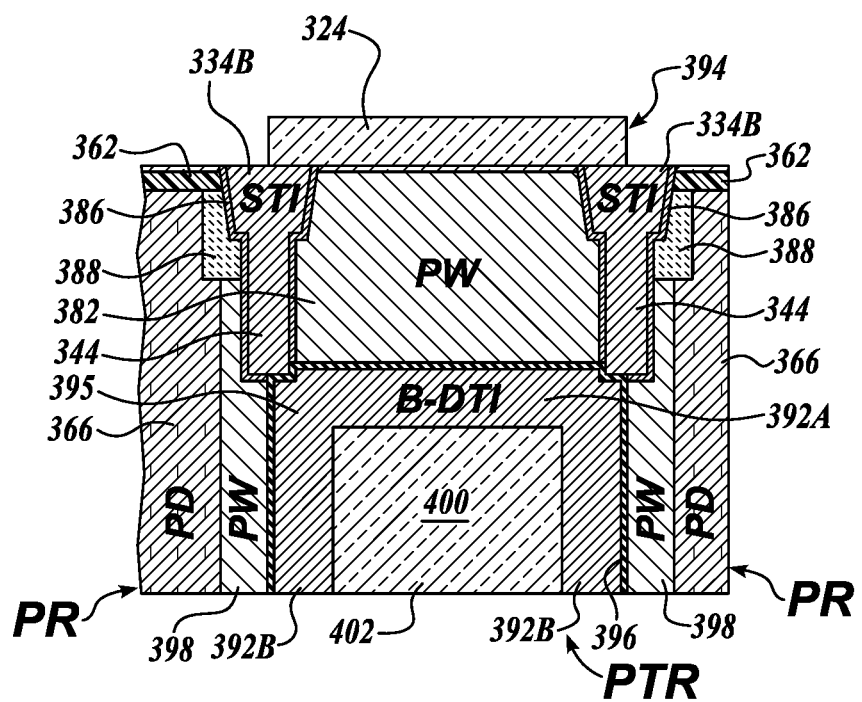
Figure 4C:
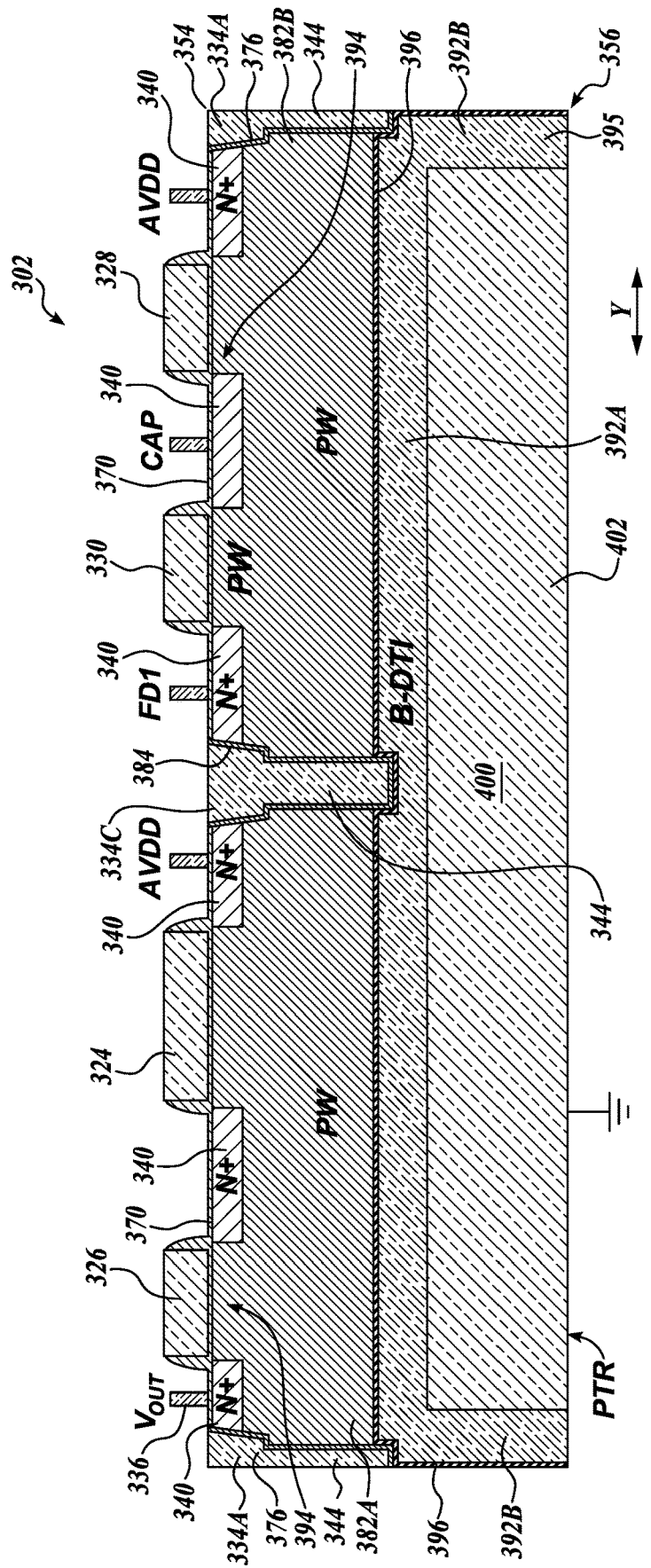

FIGS. 4A-4C are cross-section views of a portion of a pixel array, such as pixel array 302, taken along lines A-A, B-B, and C-C, respectively, of FIG. 3. The following discussion begins with FIG. 4A, which depicts a longitudinal cross section of the pixel array 302 through the pixel regions PR of pixel cells 310A, 310B, 310C. As shown in the example depicted in FIG. 4A, the pixel regions PR are formed or otherwise disposed in a semiconductor substrate or material 338 having a first surface 354 (e.g., front side 354) and a second surface 356 (e.g., back side 356). In an example embodiment, the semiconductor substrate or material 338 is approximately 2.5 μm thick, although other semiconductor material thicknesses may be employed. In one example the thickness of the semiconductor substrate or material 338 ranges from 2 μm-6 μm.

The pixel region PR of the pixel cell 310B includes first and second photosensitive regions disposed in the semiconductor material 338 for forming the first and second photodiodes 314, 316 (See FIG. 3). In the example depicted in FIG. 4A, the first photosensitive region includes first photodiode 314. In an embodiment, the first photodiode 314 includes a (P+) doped pinned layer 360 proximate the front side 354 of the semiconductor material 338 and (N−) doped region 364 disposed below the pinned layer 360 and extending depthwise in the semiconductor material 338 forming an n-type pinned photodiode (NPPD). Likewise, the second photosensitive region also includes second photodiode 316. In an embodiment, the second photodiode 316 includes a (P+) doped pinned layer 362 proximate the front side 354 of the semiconductor material 338 and a (N−) doped region 366 disposed below the pinned layer 362 and extending depthwise in the semiconductor material 338 forming an n-type pinned photodiode (NPPD). In one example embodiment, a thin oxide layer 370 is disposed over the front side of the pinned layers 360, 362 of the first and second photodiodes 314, 316. It is appreciated that doped region 364 and 366 of photodiodes may have different concentration depending on specific photodiode design e.g., full well capacity and charge transfer efficiency. In some embodiments, doped region 364 and 366 of photodiodes may include multiple implantation of different concentration for example to form a gradient doping profile.

In the example depicted in FIG. 4A, the pixel cell 310B includes (P) doped well regions (PW) 372, sometimes referred herein as P-well regions 372, disposed in the semiconductor material 338. In an example embodiment, a P-well region 372A is positioned between the first and second photodiodes 314, 316 for separation and isolation purposes. In addition, P-well regions 372B are positioned on the sides of first and second photodiodes 314, 316 opposite the P-well region 372A in order to separate the first and second photodiodes 314, 316 from the photodiodes of adjacent pixel cells 310A, 310C. In embodiments, the (P+) doped pinned layer 362 is coupled to the (P) doped well regions (PW) 372. In an embodiment, the (P+) doped pinned layer 362 and the (P) doped well regions (PW) 372 are coupled to ground, for example through a P+ contact.

Pixel cell 310B also includes a floating diffusion (FD) region (e.g., a first floating diffusion region FD1 of FIG. 2) disposed in the semiconductor material 338 proximate the front side 354 of the semiconductor material 338 for forming the floating diffusion 322. In the example depicted in FIG. 4A, the floating diffusion 322 is formed by a (N+) doped region surrounded by the P-well region 372A on at least three sides. In one example, floating diffusion (FD) region is formed in the P-well region 372A. A first transfer gate 318 is formed or otherwise disposed proximate the front side 354 of semiconductor material 338 on a first side of the floating diffusion 322 and over a first channel region. The first transfer gate 318 is coupled to transfer the image charge from the first photodiode 314 to the floating diffusion 322 through the first channel region. A second transfer gate 320 is formed or otherwise disposed proximate the front side 354 of semiconductor material 338 adjacent the other, second side of the floating diffusion 322 over a second channel region. The second transfer gate 320 is coupled to transfer the image charge from the second photodiode 316 to the floating diffusion 322 through the second channel region.

In one example embodiment, a thin oxide layer, such as thin oxide layer 370, is disposed over the entire front side 354 of the P-well region 372A, which includes sections under and between the first and second transfer gates 318, 320. Sections of thin oxide layer under the first and second transfer gates 318, 320 and other transistor gates function as gate oxide to the associated pixel transistors. As such, the P-well region 372A in conjunction with the thin oxide layer 348 isolates the floating diffusion 322 from the first and second transfer gates 318, 320.

Pixel array 302 also includes trench isolation structure. For example, the trench isolation structure includes shallow trench isolation (STI) regions disposed in the semiconductor material 338 proximate the front side 354 of the semiconductor material 338 for forming the shallow trench isolation structure 334A. Shallow trench isolation structure 334A is positioned between photodiodes of adjacent pixel cells 310A, 310C for isolation purposes. In the example depicted in FIG. 4A, shallow trench isolation structure 334A extends into each P-well region 372B depthwise for a first depth from front side 354 towards the back side 356 of the semiconductor material 338. In an example embodiment, the shallow trench isolation structure 334A includes a dielectric fill material (such as silicon oxide) filling the shallow trench isolation structure 334A and an optional dielectric layer 376 lining the sides of the dielectric fill material. In an example embodiment, the optional dielectric layer 376 is adjacent the P-well region 372B and the sides of the pinned layers 360, 362 of adjacent pixel regions. In an example embodiment, the shallow trench isolation structure 334A extends into the semiconductor material 338 between approximately 3%-7% of the thickness of the semiconductor material 338. In an example embodiment, the shallow trench isolation structure 334A extends into the semiconductor material 338 a depth of approximately 0.15 μm.

The trench isolation structure of the pixel array 302 further includes a front side deep trench isolation (F-DTI) structure 344 disposed in the semiconductor material 338 and extending from the front side 354 of the semiconductor material 338 towards the back side 356 of the semiconductor material 338. In the example embodiment of FIG. 4A, the front side deep trench isolation structure 344 extends from the bottom of each shallow trench isolation structure 334A towards the back side 356 of the semiconductor material 338. In one example, the front side deep trench isolation structure 344 is formed by etching through the respective shallow trench isolation structure 334A to a second depth into P-well region 372B. The second depth is greater than the first depth with respect to the front side 354 of semiconductor material 338.

In an example embodiment, the front side deep trench isolation structure 344 includes a dielectric fill material and an optional dielectric layer, such as dielectric 376, lining the sides and bottom of the dielectric fill material. In an example embodiment, the front side deep trench isolation structure 344 can be integrally formed with the shallow trench isolation structure 334A. In an example embodiment, the dielectric layer 376 is adjacent pinned layer 360 and the P-well region 372B. In an example embodiment, the combined shallow trench isolation structure 334A/334B, front side deep trench isolation structure 344 extends into the semiconductor material 338 between approximately 40%-60% of the thickness of the semiconductor material 338. In an example embodiment, the front side deep trench isolation structure 344 has a length (in the depth direction) of between approximately 0.85 and 1.10 µm. In an example embodiment, the front side deep trench isolation structure 344 has a width along Y-direction of about 0.20 µm. In one example, the front side deep trench isolation structure 344 has a trench width along Y-direction that is less than the trench width of the respective shallow trench isolation structure 334.

In the example depicted in FIG. 4A, the trench isolation structure of the pixel array 302 further includes back side deep trench isolation (B-DTI) structure 342 disposed in the semiconductor material 338 and extending from the back side 356 of the semiconductor material 338 towards the front side 354 of the semiconductor material 338. The back side deep trench isolation (B-DTI) structure 342 may be vertically aligned with the respective front side deep trench isolation structure 344. In one example, the back side deep trench isolation (B-DTI) structure 342 has a bottom trench width that is substantially the same a bottom trench width of the respective front side deep trench isolation structure 344. In one example, the back side deep trench isolation (B-DTI) structure 342 extend into the semiconductor material 338 and is in contact with the bottom of the respective front side deep trench isolation structure 344.

For example, back side deep trench isolation structure 342 extend into P-well regions 372B to further isolate (e.g., minimize crosstalk, noise, etc.) the first and second photodiodes 314, 316 of pixel cell 310B from the photodiodes of adjacent pixel cells 310A, 310C. In an example embodiment, back side deep trench isolation structure 342 extends laterally across the pixel cells 310 in the X-direction. In an example embodiment, additional back side deep trench isolation structure (not shown) may optionally extend depthwise into the P-well region 372A to further minimize crosstalk, etc., between the first and second photodiodes 314, 316 of the pixel cell 310B. In an example embodiment, this optional back side deep trench isolation structure 342 extends laterally across at least a majority of the pixel region PR of the pixel cells 310 in the X-direction.

In an example embodiment, the back side deep trench isolation structure 342 includes a dielectric fill material 395 (e.g., silicon oxide or low k oxide material) and a dielectric layer 378 adjacent the sides of the dielectric fill material 395. In one example, the dielectric layer 378 surrounds the sidewalls and bottom of the dielectric fill material 395 to form the back side deep trench isolation structure 342. In an example embodiment, the dielectric layers 378 is adjacent the P-well regions 372B. In some example embodiments, the back side deep trench isolation structure 342 are generally aligned with the front side deep trench isolation structure 344 and abut against the bottom thereof. In an example embodiment, the back side deep trench isolation structure 342 has a width of about 0.15 µm.

The pixel transistor region PTR of pixel cell 310B will now be described with reference to FIGS. 4B and 4C. FIG. 4B is a lateral cross-section view of the pixel array 30 through the amplifier transistor (e.g., source follower (SF)) of the pixel transistor region PTR of FIG. 3. As such, FIG. 4B depicts a cross sectional view across the pixel transistor region PTR of pixel cell 310B, which is disposed adjacent subpixel region SPR2 of pixel cell 310B and subpixel region SPR2 of pixel cell 310E. FIG. 4C is a longitudinal cross-section view of the pixel array 302 along the transistor channel length direction of the pixel transistor region PTR of FIG. 3.

As shown in the example depicted in FIGS. 4B and 4C, the pixel transistor region PTR of pixel cell 310B includes a plurality of transistor gates, including reset transistor gate 328, dual floating diffusion transistor gate 330, amplifier transistor gate 324 and row select gate 326, as well as source/drains 340 formed or otherwise disposed in/on the front side 354 of the semiconductor material 338. In one example embodiment, the respective gates and sources/drains of the pixel transistor region PTR are generally aligned to form a transistor channel region 394, such as a (N) channel region, having a length direction corresponding to the Y-direction of the semiconductor material 338.

Beneath the transistor gates and surrounding the source/drains 340 there is formed a (P) doped well (PW) region or P-well region 382 extending depthwise into the semiconductor material 338. In some embodiments, the P-well region 382 extends into the front side 354 of the semiconductor material 338 a depth that does not exceed the bottom of the front side deep trench isolation structure 344. Separating the transistor gates of the pixel transistor region PTR from the P-well region 382 is a thin film dielectric layer, such as dielectric layer 370.

In the example depicted in FIGS. 4B, 4C, the pixel transistor region PTR also includes trench isolation structure. For example, the trench isolation structure includes shallow trench isolation (STI) regions disposed in the semiconductor material 338 proximate the front side 354 for forming shallow trench isolation structure 334A, 334B, 334C. In the example embodiment, the pixel array 302 includes shallow trench isolation structure 334A positioned along the X-direction between pixel regions PR of pixel cells 310, and between the pixel transistor region PTR of pixel cell 310B and the pixel transistor regions of pixel cells 310A, 310C adjacent thereto. In the example depicted in FIGS. 4B, 4C, the pixel transistor region PTR of pixel cell 310B also includes shallow trench isolation structure 334B positioned adjacent pixel regions PR of the pixel cells along the Y-direction providing isolation between pixel cells and pixel transistors in the semiconductor material 338. The pixel transistor region PTR of pixel cell 310B further includes shallow trench isolation structure 334C positioned between the first transistor section (e.g., reset transistor 328, dual floating diffusion transistor 330, etc.) of the pixel transistor region PTR and the second transistor section (e.g., amplifier transistor 324, row select transistor 326) of the pixel transistor region PTR. In an example embodiment, the shallow trench isolation structures 334A, 334B extend laterally and longitudinally across the pixel array 302 in the X, Y directions in a grid like pattern (See FIG. 3).

In the example depicted in FIGS. 4B, 4C, the shallow trench isolation structures 334A, 334B, 334C extend depthwise into of the semiconductor material 338 towards the back side 354 of the semiconductor material 338. In some embodiments, the shallow trench isolation structure 334B, 334C extend into the front side 354 of the semiconductor material 338 a depth similar to shallow trench isolation structure 334A described above. In an example embodiment, the shallow trench isolation structure 334A includes a dielectric fill material (e.g., silicon oxide) and an optional dielectric layer 376 lining the sides and bottom of the dielectric fill material. Similarly, the shallow trench isolation structure 334B, 334C in an example embodiment each include an dielectric fill material (e.g., silicon oxide) and optional dielectric layers 376, 384, respectively lining the sides and bottom of the dielectric fill material.

In the example depicted in FIGS. 4B, 4C, the trench isolation structure of the pixel array 302 also includes front side deep trench isolation regions for forming front side deep trench isolation (F-DTI) structure 344. For example, the front side deep trench isolation structure 344 extends from the bottom of each respective shallow trench isolation structure 334A, 334B, 334C towards the back side 356 of the semiconductor material 338. In an example embodiment, the front side deep trench isolation structure 344 extending from shallow trench isolation structure 334A includes a dielectric fill material and an optional dielectric layer, such as dielectric layer 376, lining the sides and bottom of the dielectric fill material. Similarly, the front side deep trench isolation structure 344 extending from shallow trench isolation structure 334B, 334C include a dielectric fill material and optional dielectric layers, such as dielectric layers 386, 384, respectively, lining the sides and bottom of the dielectric fill material. In an example embodiment, the front side deep trench isolation structure 344 can be integrally formed with the respective shallow trench isolation structure 334A, 334B, and 334C.

In the pixel transistor region PTR shown in FIG. 4B, the optional dielectric layer 386 for each front side trench isolation structure (formed of shallow trench isolation structure 334B and front side deep trench isolation (F-DTI) structure 344) is adjacent the P-well region 382 on the inwardly facing side. On its outwardly facing side, the optional dielectric layer 386 is adjacent pinned layer 362 of an adjacent pixel region, a (P) doped region 388, such as a highly doped (P+) boron isolation implant region, positioned beneath a portion of the pinned layer 362, and a P-well region 398 that extends to the back side 356 of the semiconductor material 338 from the (P) doped region 388. The optional dielectric layer 386 also is adjacent back side deep trench isolation structure (e.g., back side deep trench isolation structure sections 392A, 392B) described below. In an example embodiment, the (P) doped regions 388 extend the entire lengthwise direction of the pixel transistor region PTR. In one example, the (P) doped region 388 surrounds the shallow trench isolation structure 334A, 334B.

In the pixel transistor region PTR shown in FIG. 4C, the optional dielectric layers 376, 384 for the respective front side trench isolation structure (formed of shallow trench isolation structure 334A, 334C and respective front side deep trench isolation (F-DTI) structure 344) is adjacent the source/drains 340 and the P-well region 382. The optional dielectric layer 376 also is adjacent the back side deep trench isolation structure, e.g., sections 392A, 392B, described below. Similarly, the optional dielectric layer 384 also is adjacent the back side deep trench isolation structure, e.g., section 392A, at about the midspan thereof.

In the pixel transistor regions PTR shown in FIGS. 4B, 4C, and as described above, the front side trench isolation structure 334/344 extends into the semiconductor material 338 between approximately 40%-60% of the thickness of the semiconductor material 338. In an example embodiment, the front side deep trench isolation structure 344 has a length (in the depth direction) of between approximately 0.85 and 1.10 µm. In an example embodiment, the front side deep trench isolation structure 344 has a width of about 0.20 µm. In an embodiment, the front side deep trench isolation structure 344 extend below the P-well 382.

In the example depicted in FIGS. 4B, 4C, the pixel transistor region PTR also includes backside deep trench isolation structure. For example, the trench isolation structure in the pixel transistor region PTR includes back side deep trench isolation (B-DTI) structure disposed in the semiconductor material 338 proximate the back side 356 for forming back side trench isolation structure, e.g., back side deep trench isolation structure sections 392A, 392B. In the example depicted in FIGS. 4B, 4C, the back side deep trench isolation structure includes a first, horizontally disposed, back side deep trench isolation structure section 392A disposed below the P-well region 382. In an example embodiment, the first deep trench isolation structure section 392A extends both laterally and longitudinally outwardly to abut against the front side deep trench isolation structure 344. In the embodiment shown, the first deep trench isolation structure section 392A is in contact with front side deep trench isolation structure 344 associated with the shallow trench isolation structure 334C, as shown in FIG. 4C.

The back side deep trench isolation (B-DTI) structure also includes a second, vertically disposed, back side deep trench isolation structure section 392B. The back side deep trench isolation structure section 392B extends from the back side 356 of the semiconductor material 338 towards the front side 354 of the semiconductor material 338. In the example embodiment, the back side deep trench isolation structure section 392B contacts or abuts against the front side deep isolation structure 344 as shown in FIGS. 4B, 4C. In other words, the back side deep trench isolation structure section 392B extends from the back side 356 of the semiconductor material 338 and is landed on the respective front side deep trench isolation structure 344. In an example embodiment, the second back side deep trench isolation structure section 392B extend laterally outwardly to about the mid-region of the shallow trench isolation structure 334, as shown in FIG. 4B.

Of course, back side deep trench isolation structure sections 392A, 392B can be integrally formed in some embodiments. Together, the back side deep trench isolation structure sections 392A, 392B form an open, box-like structure that encloses or surrounds a region 400 that extends from the back side of the semiconductor material 338. In one example embodiment, the region 400 is filled with a conductive material 402 (e.g., polycrystalline silicon) and is coupled to ground (shown with electrical ground symbol in FIG. 4C). In an example embodiment, the back side deep trench isolation structure section 392A extends between the front side deep trench isolation structure 344 and abuts against the sides thereof.

In an example embodiment, the back side deep trench isolation structure sections 392A, 392B include a dielectric fill material 395 (e.g., silicon oxide) and a dielectric layer 396 lining the top and sides of the back side deep trenches of the back side deep trench isolation structures. The dielectric layer 396 is adjacent the P-well regions 372 (not shown), 382, 398, as well as portions of the front side trench isolation structure 344. The dielectric fill material 395 is deposited into the back side deep trenches of the back side deep trench isolation structure sections 392A, 392B on dielectric layer 396, for example by a chemical vapor disposition process.

The shallow trench isolation structure 334A, 334B, the front side deep trench isolation structure 344 and the back side deep trench isolation structure sections 392A, 392B together encloses a transistor channel region that includes a P-well region (e.g., P-well region 382) having pixel transistors formed therein such that the P-well region having pixel transistors is floating.

In one example, the front side trench isolation structure and the back side trench isolation structure collectively isolated the P-well region 382 with the floating diffusion and source/drains of transistors from other well regions. In an example, the front side trench isolation structure and the back side trench isolation structure collectively separate the P-well region 382 with the floating diffusion and source/drains of transistors into P-well regions 382A, 382B. For example, the shallow trench isolation structure 334A, 334B, 334C, the front side deep trench isolation structure 344 and the back side deep trench isolation structure sections 392A, 392B collectively provide electrical isolation between the P-well region 382A having source/drains associated with amplifier transistor and row select transistor, wherein the source of amplifier transistor coupled to a supply voltage (e.g., AVDD), and the P-well region 382B having source/drains associated with dual floating diffusion transistor and reset transistor, wherein the drain of the reset transistor is coupled to the supply voltage for providing the preset voltage resetting floating diffusion 322.

For example, the shallow trench isolation structure 334A, 334B, 334C, the front side deep trench isolation structure 344 and the back side deep trench isolation structure sections 392A, 392B collectively provide electrically isolation between the P-well region 382 and a P-well region having P+ doped region with contact (often referred as P+ contact) coupled to ground. For example, the front side shallow trench isolation structure 334A, 334B, 334C, the front side deep trench isolation structure 344 and the back side deep trench isolation structure sections 392A, 392B collectively provide electrically isolation between the P-well region 382A and 382B and between P-well regions 382A and 382B and the P-well region having P+ doped region with contact (often referred as P+ contact) coupled to ground. As such, junction leakage current path associated with the floating diffusion can be eliminated, thereby preventing floating diffusion junction leakage.

The dielectric layer 396, and optional dielectric layers 376, 378, 384, 386 described referencing FIGS. 4A-4C above can be, for example, silicon oxide or any high K material. In some embodiments, the dielectric layer 396, and optional dielectric layers 376, 378, 384, 386 include one or a combination from the following: silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or other suitable dielectric material. In one embodiment, the dielectric layer 396, and optional dielectric layers 376, 378, 384, 386 have an average thickness from about 10 nm to about 20 nm, although other thicknesses may be practiced with embodiments of the present disclosure. The dielectric fill material employed for filling shallow trench isolation structure 334A, 334B, and the front side deep trench isolation structure 344, and back side deep trench isolation structure 342, 392A, 392B can be the same or different material.

As was described briefly above, methods are contemplating for suppressing floating diffusion junction leakage in CMOS image sensors. In that regard, methods for reducing diffusion leakage in a pixel array are provided. In an example embodiment, the pixel array is formed in a semiconductor substrate and has a plurality of adjacently positioned pixel cells, each pixel cell including a pixel region having at least one photosensitive element and a pixel transistor region disposed adjacent the pixel region. In some example embodiments, the pixel transistor region comprises at least one floating diffusion region, a plurality of transistor gates, a plurality of drain/source regions having a first type and being associated with the plurality of transistor gates, and a doped well region disposed in the semiconductor substrate below the plurality of transfer gates and surrounding the plurality of drain/source regions and the floating diffusion region, the dope well region having a second type different from the first type.

A method, in an embodiment, comprises isolating the pixel transistor region by encapsulating the doped well region with trench isolation structure disposed in the semiconductor substrate. In some example embodiments of the method, the trench isolation structure includes both front side shallow and deep isolation structure as well as back side deep trench isolation structure that together allow the doped well region to electrically float. In some example embodiments, the back side deep isolation structure separates the doped well region from a grounded conductive region, and at least one of the source/drains is connected to a voltage source. Additionally, the method may comprise isolating pixel regions of adjacent pixel cells with trench isolation structure that extends from a front side of the semiconductor substrate to a back side of the semiconductor substrate.

Figure 5:
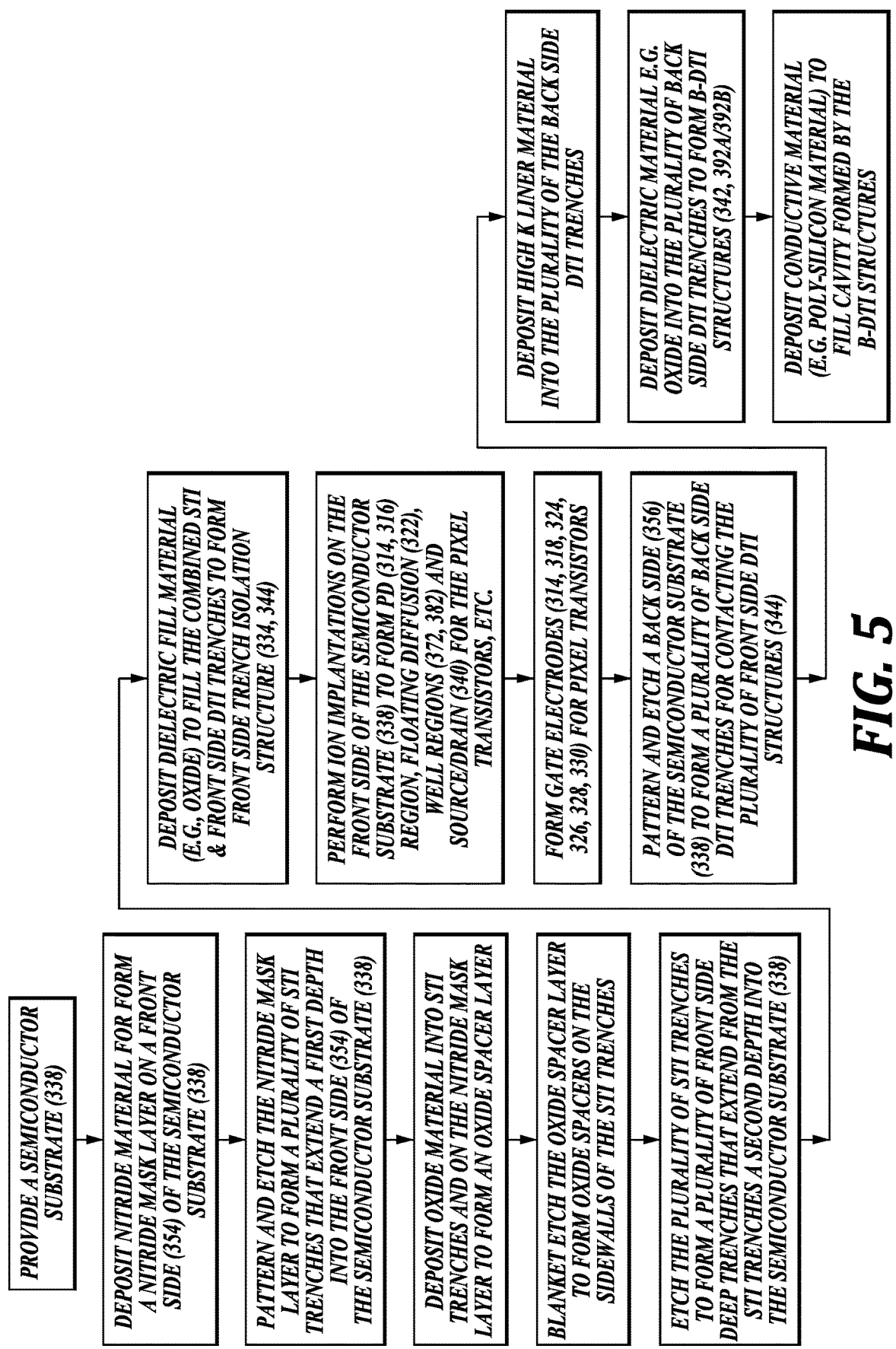
FIG. 5 is an example flow chart for fabricating the pixel array of FIG. 4 in accordance with an embodiment of the present disclosure.

FIG. 5 is a flow chart illustrating one example of a method for fabricating a pixel array, such as pixel array 302, in accordance with the teachings of the present disclosure. It will be appreciated that the following method steps can be carried out in any order or at the same time, unless an order is set forth in an express manner or understood in view of the context of the various operation(s). Additional process steps can also be carried out, including chemical-mechanical polishing, masking, additional doping, etc. Of course, some of the method steps can be combined or omitted in example embodiments.

Referring now to FIG. 5, a method for fabricating a pixel array comprising one or more pixel cells will be described in more detail. Each pixel cell to be fabricated includes a pixel region PR and a pixel transistor region PTR. As shown in the example of FIG. 5, the method begins with providing a semiconductor substrate 338 having a front side 354 and a back side 356. Next, the front side trench isolation structure, such as shallow trench isolation structure 334A-334C and front side deep trench isolation structure 344, is formed. After the front side trench isolation structure is formed, one or more method steps can be carried out to complete the front side of the semiconductor substrate. A completed front side can be referred to as a semi-fabricated state of the semiconductor substrate. Once the front side is completed, the back side trench isolation structure, such as back side deep trench isolation structure, e.g., back side deep trench isolation structure 342, back side deep trench isolation structure sections 392A, 392B, is formed.

In an example embodiment, a completed front side can include, for example, a semiconductor substrate 338 having a pixel region PR comprising one or more transfer gates, such as transfer gates 318, 320, a P-well (PW) 372, at least one photodiode (PD), such as photodiodes 314, 316, and an implant region, such as a floating diffusion 322, as shown in FIG. 4A. The completed front side in some embodiments also includes a pixel transistor region PTR comprising source/drain regions 340, transistor gates, such as gates 324, 326, 328, 330, formed on a front-side of the semiconductor substrate 338, a P-well region 382, as shown in FIG. 4B. Of course, the number of transistor components may vary between pixel cell architecture types, and thus, a completed front side may vary in example embodiments of the present disclosure.

In order to form the front side trench isolation structure, such as front side shallow trench isolation structure 334A, 334B, 334C and front side deep trench isolation structure 344, the following process steps can be carried out on the semiconductor substrate 338. First, a masking material, such as a nitride material, is deposited to form a nitride mask layer on the front side 354 of the semiconductor substrate 338. Next, the nitride mask layer is patterned and then etched to form front side shallow isolation (STI) trenches extending a first depth (e.g., about 0.15 μm) into the front side 354 of the semiconductor substrate 338. In example embodiments, the front side shallow isolation (STI) trenches are formed in a grid-like pattern between pixel regions of adjacent pixel cells and between the pixel transistor region and the pixel regions of the pixel cells.

Once the front side shallow isolation (STI) trenches are etched, an oxide material is deposited into the trenches and on the nitride mask layer to form an oxide spacer layer conformal to the inner surfaces of front side shallow isolation (STI) trenches. Blanket etching is then carried out on the oxide spacer layer to form oxide spacers on the sidewalls of front side shallow isolation (STI) trenches protecting sidewalls of the front side shallow isolation trench from being over-etched in subsequent front-side deep trench isolation (DTI) trenches etching process. Next, the front side shallow isolation (STI) trenches are etched, for example by a dry etch, to form front-side deep trench isolation (DTI) trenches that extend into the semiconductor substrate 338 from the bottom of the front side shallow isolation (STI) trenches a second depth (e.g., between about 0.85 and about 1.10 μm) with respect to the front side 354 of semiconductor material 338. Dielectric fill material (e.g., silicon oxide) is then deposited to fill the combined front side STI and DTI trenches.

In order to form the back side trench isolation structure, such as back side deep trench isolation structure 342, 392A, 392B, the following process steps can be carried out on the semiconductor substrate 338 in a semi-fabricated state. For example, once the one or more pixel cells of a pixel array is provided in a semi-fabricated state, the back side 356 of the semiconductor substrate 338 is patterned and then etched to form back side deep isolation (B-DTI) trenches extending into the back side 356 of the semiconductor substrate 338. In example embodiments, first back side deep isolation (B-DTI) trenches are formed beneath the front side trench isolation structure (formed of front side shallow trench isolation structure 334A and front side deep isolation structure 344) between pixel regions of adjacent pixel cells, and second back side deep isolation trenches are formed beneath the P-well region 382 of the pixel transistor regions PTR. In an embodiment, back side deep isolation (B-DTI) trenches surround the pixel transistor regions PTR of the pixel cells from the back side thereof. In some example embodiments, the back side deep isolation (B-DTI) trenches are etched to a depth of the front side deep isolation structure 344, or can be over-etched by approximately 1000 Å, for example, to ensure physical contact therebetween.

In one embodiment, the trench width of each back side deep isolation (B-DTI) trench of the back side deep trench isolation structure section 392B along the Y-direction is greater than the trench width of each back side deep isolation (B-DTI) trench of the back side deep trench isolation structure 342. The back side deep isolation (B-DTI) trenches are lined by depositing a high K liner material in the back side 356 of the semiconductor substrate, and then filled with a dielectric material, such as dielectric fill material 395 (e.g., silicon oxide). The dielectric fill material 395 is deposited to completely fill back side deep isolation trenches for the back side deep trench isolation structure 342 while partially filling the back side deep isolation trenches for the back side deep trench isolation structure section 392A, 392B. Partially filling the back side deep isolation trenches with a dielectric fill material forms an open ended cavity. As will be described below, this open ended cavity can be filled with a conductive material 402.

In the example embodiments, the formed back side deep trench isolation structures 342, 392A, 392B contact the bottom of respective front side trench isolation structure 334A-334C/344 previously formed in the semiconductor substrate 338. Together, the back side deep trench isolation structure 342 and the front side trench isolation structure 334, 344 isolate the pixel regions PR of adjacent pixel cells 310. Similarly, the back side deep trench isolation structure 392A, 392B and the front side trench isolation structure 334A-334C, 344 together isolate the pixel transistor region PTR from adjacent pixel regions PR by enclosing or rather encapsulating the P-well region 382.

In some example embodiments, formation of the back side of deep trench isolation, such as back side trench isolation structure sections 392A, 392B form a cavity or opening exposed to the back side 356 of the semiconductor material 338. The size of cavity or opening is determined by the dielectric fill material deposition in the back side deep isolation (B-DTI) trenches of the back side deep trench isolation structure sections 392A, 392B. In these examples, the method further comprises filling the cavity with a conductive material 402, such as polysilicon, to form region 400, and then coupling the conductive material to ground, for example through a backside contact. Thereafter, chemical-mechanical polishing (CMP) can be carried out on various regions of the semiconductor substrate 338.

While example embodiments described above relate to a shared pixel cell, other architectures, such as non-shared pixel cells (e.g., one photosensitive region per pixel transistor region), may employ the methodologies and technologies of the present disclosure. Also, the present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the present disclosure, as claimed. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A LOFIC pixel cell for a CMOS image sensor, comprising:
    a semiconductor substrate having a front side and a back side;
    a pixel region including a photosensitive region and a floating diffusion disposed in the semiconductor substrate, wherein the photosensitive region accumulates image charge photogenerated in photosensitive region in response to incident light, and wherein the floating diffusion region is coupled to receive the image charge from the photosensitive region;
    a first pixel transistor region disposed in the semiconductor substrate comprising a reset transistor-and a dual floating diffusion transistor, wherein the reset transistor and the dual floating diffusion transistor are formed in a same first doped well region, and wherein a drain of the reset transistor is coupled to a source of the dual floating diffusion transistor;
    a second pixel transistor region disposed in the semiconductor substrate comprising a row select transistor coupled to a bitline and an amplifier transistor, the amplifier transistor having a drain coupled to the supply voltage, and a source coupling to a bitline through a drain of the row select transistor, wherein the row select transistor and the amplifier transistor are formed in a same second doped well region; and wherein the first pixel transistor region and the second pixel transistor region are arranged in a straight line; and
    within the pixel region, a trench isolation structure configured to enclose the first pixel transistor region for isolating the first pixel transistor region from the pixel region and from the second pixel transistor region, the trench isolation structure comprising a front side trench isolation structure and a back side deep trench isolation structure,
    wherein the front side trench isolation structure comprises:
        a front side shallow trench isolation structure in the front side of the semiconductor substrate and enclosing at least a portion of a transistor channel region of the dual floating diffusion transistor; and
        a front side deep trench isolation structure extending from the front side shallow trench isolation structure, the front side deep trench isolation structure enclosing at least a portion of the transistor channel region of the dual floating diffusion transistor,
    wherein a first fill material of the front side deep trench isolation structure and a second fill material of the back side deep trench isolation structure are separated by at least one dielectric layer.

2. A LOFIC pixel cell for a CMOS image sensor, comprising:
    a semiconductor substrate having a front side and a back side;
    a pixel region including a photosensitive region, a transfer gate and a floating diffusion region disposed on the semiconductor substrate, wherein the photosensitive region accumulates image charges photogenerated in photosensitive region in response to incident light, and wherein the transfer gate couples the photodiode sensitive region to the floating diffusion region transferring image charges to the floating diffusion;
    a first pixel transistor region disposed in the semiconductor substrate including a first transistor and a third transistor, the first transistor coupling the floating diffusion region to a capacitor, wherein the first transistor and the third transistor are formed in a same first doped well region, and wherein a drain of the first transistor is coupled to a source of the third transistor;
    a second pixel transistor region disposed in the semiconductor substrate including a second transistor and a fourth transistor, the second transistor having a gate coupled to the floating diffusion region, a drain of the second transistor coupling to a supply voltage, and a source of the second transistor coupling to a drain of the fourth transistor, and a source for the fourth transistor coupling to a bitline, wherein the second transistor and the fourth transistor are formed in a same second doped well region; and wherein the first pixel transistor region and the second pixel transistor region are arranged in a straight line; and
    within the pixel region, a trench isolation structure configured to enclose the first pixel transistor region for isolating the first pixel transistor region from both the pixel region and the second pixel transistor region, the trench isolation structure comprising a front side trench isolation structure and a back side deep trench isolation structure,
    wherein the front side trench isolation structure comprises:

a front side shallow trench isolation structure in the front side of the semiconductor substrate and enclosing at least a portion of the first pixel transistor region; and a front side deep trench isolation structure extending from the front side shallow trench isolation structure, the front side deep trench isolation structure enclosing at least a portion of the first pixel transistor region, wherein a first fill material of the front side deep trench isolation structure and a second fill material of the back side deep trench isolation structure are separated by at least one dielectric layer.

3. The LOFIC pixel cell of claim 2 wherein the back side deep trench isolation structure further encloses a back side region in the semiconductor substrate separate from the first pixel transistor region, the back side region being a conductive region that is coupled to ground.

4. The LOFIC pixel cell of claim 2 wherein the back side deep trench isolation structure includes a first section positioned under and delimiting a transistor channel region of the first transistor of the first pixel transistor region, the second fill material of the first section of the back side deep trench isolation structure contacting the first fill material of the front side deep trench isolation structure through the at least one dielectric layer to enclose the transistor channel region of the first transistor of the first pixel transistor region.

5. The LOFIC pixel cell of claim 4 wherein the back side deep trench isolation structure further includes second sections that extend orthogonally from the back side and the second fill material of the second section of the back side deep trench isolation structure contact the first fill material of the front side deep trench isolation structure through the at least one dielectric layer.

6. The LOFIC pixel cell of claim 5 wherein the second sections of the back side deep trench isolation structure form walls and the first section of the back side deep trench isolation structure forms a top, the walls and the top together defining a back side region in the semiconductor substrate separate from the transistor channel region of the first transistor of the first pixel transistor region, the back side region being a conductive region that is coupled to ground.

7. The LOFIC pixel cell of claim 2 wherein the trench isolation structure is lined with at least one dielectric material.

8. The LOFIC pixel cell of claim 2
wherein the trench isolation structure separates and isolates a first doped well region of the first pixel transistor region from a second doped well region of the second pixel transistor region.

9. The LOFIC pixel cell of claim 8 wherein the first doped well region is a P-type doped well region.

10. The LOFIC pixel cell of claim 8 wherein the front side deep trench isolation structure extends from the front side of the semiconductor substrate into the semiconductor substrate to contact the back side deep trench isolation structure such that the trench isolation structure surrounds the first doped well region of the first pixel transistor.

11. The LOFIC pixel cell of claim 8, wherein the first doped well region is enclosed by the trench isolation structure and is electrically floating.

12. The LOFIC pixel cell of claim 2, wherein the back side deep trench isolation structure includes a first back side deep trench isolation structure formed by one or more first back side deep isolation trenches in the semiconductor substrate, wherein the one or more back side deep isolation trenches, each has the second fill material lined with a dielectric layer of the at least one dielectric layer.

13. The LOFIC pixel cell of claim 12, wherein the back side deep trench isolation structure includes a second back side deep trench isolation structure formed by a second back side deep isolation trench that is lined with a dielectric layer of the at least one dielectric layer and partially filled with the second fill material in order to form a back side open-ended cavity, wherein a conductive material is disposed in the back side open-ended cavity and is surrounded by the second fill material.

14. A pixel array for a CMOS image sensor, comprising:
a semiconductor substrate having a front side and a back side;
a plurality of pixel cells formed in the semiconductor substrate, each pixel cell including a pixel region having at least one photosensitive element, a first floating diffusion, and a transfer gate coupling the at least one photosensitive element to the first floating diffusion and a pixel transistor region disposed adjacent the pixel region, the pixel transistor region comprising:
a first pixel transistor region, comprising:
a second floating diffusion region, and at least one transistor gate on the front side of the semiconductor substrate, the second floating diffusion region having a first type, wherein the second floating diffusion region is coupled to a capacitor;
a first doped well region disposed in the semiconductor substrate surrounding the second floating diffusion region, the first doped well region having a second type different from the first type;
a first transistor coupled between the first floating diffusion region and the second floating diffusion region; and
a third transistor, wherein the first transistor and the third transistor are formed in a same first doped well region, and wherein a drain of the first transistor is coupled to a source of the third transistor;
a second pixel transistor region, comprising:
a second doped well region disposed in the semiconductor substrate;
a second transistor having a gate coupled to the first floating diffusion region, a drain of the second transistor being disposed in the second doped well region, and a source of the second transistor being disposed in the second doped well region and coupled to receive a supply voltage; and
a fourth transistor, wherein the second transistor and the fourth transistor are formed in a same second doped well region, wherein a drain of the second transistor is coupled to a source of the fourth transistor, and wherein the first pixel transistor region and the second pixel transistor region are arranged in a straight line; and
within each pixel region, a trench isolation structure configured to enclose the first pixel transistor region isolating the first doped well region of the first pixel transistor region from both the pixel region and from the second doped well region of the second pixel transistor region;
wherein the first doped well region is floating by isolating the first doped well region with the trench isolation structure disposed in the semiconductor substrate, the trench isolation structure comprising a front side trench isolation structure and a back side deep trench isolation structure,
wherein the front side trench isolation structure comprises:

a front side shallow trench isolation structure in the front side of the semiconductor substrate and extending around a perimeter of the first doped well region; and a front side deep trench isolation structure extending from the front side shallow trench isolation structure, the front side deep trench isolation structure extending around the perimeter of the first doped well region, wherein a first fill material of the front side deep trench isolation structure and a second fill material of the back side deep trench isolation structure are separated by at least one dielectric layer.

15. The pixel array of claim 14 wherein the back side deep trench isolation structure is disposed beneath the first doped well region and abuts against the first doped well region and the front side deep isolation structure, wherein the back side deep trench isolation structure together with the front side shallow trench isolation structure and the front side deep trench isolation structure encapsulates the first doped well region for isolating the first pixel transistor region from each adjacent pixel region.

16. The pixel array of claim 14 wherein the back side deep trench isolation structure includes:

a first back side deep trench isolation structure in the back side of the semiconductor substrate of the pixel region, the first back side deep trench isolation structure of the pixel region being formed by one or more first back side deep isolation trenches having the second fill material lined with a dielectric layer of the at least one dielectric, and a second back side deep trench isolation structure in the back side of the semiconductor substrate of the first pixel transistor region and the second pixel transistor region, the second back side deep trench isolation structure within the first pixel transistor region and the second pixel transistor region being formed by a second back side deep isolation trench that is partially filled with the second fill material lined with the dielectric layer in order to form a back side open-ended cavity, wherein a conductive material is disposed in the back side open-ended cavity.

17. The pixel array of claim 14, wherein the back side deep trench isolation structure comprises:

a first section positioned under and delimiting the doped well region, and a second sections integrally formed with the first section, the second sections extending orthogonally from the back side of the semiconductor substrate.

18. The pixel array of claim 17, wherein the back side deep trench isolation structure further encloses a conductive region in the semiconductor substrate separate from the doped well region, the conductive region being coupled to ground.

19. The pixel array of claim 14, wherein the back side deep trench isolation structure includes the at least one dielectric layer, and wherein the at least one dielectric layer lines one or more surfaces of the respective second fill material.

\* \* \* \* \*